United States Patent
Benveniste

(10) Patent No.: US 7,619,228 B2
(45) Date of Patent: Nov. 17, 2009

(54) TECHNIQUE FOR IMPROVED ION BEAM TRANSPORT

(75) Inventor: Victor Benveniste, Gloucester, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 395 days.

(21) Appl. No.: 11/529,508

(22) Filed: Sep. 29, 2006

(65) Prior Publication Data

US 2008/0078949 A1 Apr. 3, 2008

(51) Int. Cl.
*H01J 37/317* (2006.01)

(52) U.S. Cl. ............ 250/492.21; 350/396 R

(58) Field of Classification Search ........... 250/492.21, 250/396 R
See application file for complete search history.

(56) References Cited

U.S. PATENT DOCUMENTS

| | | | |
|---|---|---|---|
| 4,276,477 A | 6/1981 | Enge | |
| 4,283,631 A | 8/1981 | Turner | |
| 4,587,432 A | 5/1986 | Aitken | |
| 4,899,059 A | 2/1990 | Freytsis et al. | |
| 4,922,106 A | 5/1990 | Berrian et al. | |
| 5,177,366 A | 1/1993 | King et al. | |
| 5,350,926 A | 9/1994 | White et al. | |
| 5,811,820 A | 9/1998 | Kirchner et al. | |
| 5,834,786 A | 11/1998 | White et al. | |
| 6,285,133 B1 | 9/2001 | Lansford et al. | |
| 6,362,490 B1 | 3/2002 | Tomita et al. | |
| 6,441,382 B1 | 8/2002 | Huang | |
| 6,489,622 B1 | 12/2002 | Chen et al. | |
| 6,573,517 B1 | 6/2003 | Sugitani et al. | |
| 6,635,880 B1 | 10/2003 | Renau | |
| 6,777,696 B1 | 8/2004 | Rathmell et al. | |
| 6,946,667 B2* | 9/2005 | Chen et al. ............. | 250/492.21 |
| 6,998,625 B1* | 2/2006 | McKenna et al. ...... | 250/492.21 |
| 7,022,984 B1* | 4/2006 | Rathmell et al. ............ | 250/305 |
| 2003/0173914 A1 | 9/2003 | Yamashita | |
| 2004/0262542 A1 | 12/2004 | Rathmell et al. | |
| 2005/0242294 A1 | 11/2005 | Purser et al. | |
| 2005/0269526 A1 | 12/2005 | Rathmell | |
| 2006/0113495 A1 | 6/2006 | Chen et al. | |
| 2006/0169924 A1 | 8/2006 | Purser et al. | |

FOREIGN PATENT DOCUMENTS

| | | |
|---|---|---|
| EP | 1691395 A1 | 8/2006 |
| WO | WO0017905 A1 | 3/2000 |
| WO | WO02052609 A2 | 7/2002 |
| WO | WO2004112078 A2 | 12/2004 |

* cited by examiner

*Primary Examiner*—Kiet T Nguyen

(57) ABSTRACT

A technique for improved ion beam transport is disclosed. In one particular exemplary embodiment, the technique may be realized as an ion implantation system comprising an ion source for generating an ion beam, a mass analyzer for selecting a desired ion species from ion particles the ion beam, an ion decelerator configured to reduce an energy of ions in the ion beam, an end station for supporting at least one workpiece to be implanted with ions from the ion beam, and a neutral particle separator configured to remove neutrally-charged particles from the ion beam prior to reaching the ion decelerator.

14 Claims, 4 Drawing Sheets

TECHNIQUE FOR IMPROVED ION BEAM TRANSPORT

FIELD OF THE DISCLOSURE

The present disclosure relates generally to substrate processing techniques and more particularly, to a technique for improved ion beam transport in a ribbon beam ion implanter.

BACKGROUND OF THE DISCLOSURE

In semiconductor manufacturing, ion implantation is used to change material properties of portions of a substrate. Indeed, ion implantation has become a standard technique for introducing conductivity-altering impurities into semiconductor wafers to produce various semiconductor-based products. In an ion implantation process, a desired impurity material is typically ionized in an ion source, ions are accelerated to form an ion beam of prescribed energy, and the ion beam is directed at a surface of a semiconductor wafer. Energetic ions in the ion beam penetrate into bulk semiconductor material and are embedded into a crystalline lattice of the bulk semiconductor material of the wafer to form a region of desired conductivity.

Ion implantation systems typically include an ion source for converting a gas or a solid material into a well-defined ion beam. The ion beam may be mass analyzed to eliminate undesired species, accelerated to a desired energy, and then directed onto a target area, typically a surface of a wafer of semiconductor material. The ion beam may be distributed over the target area by beam scanning, target area movement, or by a combination of beam scanning and target area movement. Examples of conventional ion implanters are disclosed in U.S. Pat. No. 4,276,477 issued Jun. 30, 1981 to Enge; U.S. Pat. No. 4,283,631 issued Aug. 11, 1981 to Turner; U.S. Pat. No. 4,899,059 issued Feb. 6, 1990 to Freytsis et al.; U.S. Pat. No. 4,922,106 issued May 1, 1990 to Berrian et al.; and U.S. Pat. No. 5,350,926 issued Sep. 27, 1994 to White et al.

Ion species presently used for ion implantation in silicon include arsenic, phosphorus, germanium, boron, and hydrogen having energies that range from below 1 keV to above 80 keV. Ion currents ranging from microamperes to multi-milliamperes are typically needed. Tools providing implant currents greater than about 0.5 mA are commonly referred to as "high-current" implanters. Trends within the semiconductor industry are moving towards ion implantation energies below 1 kev and control of angle of incidence below 1 degree.

A recent improvement for ion implantation systems has been the introduction of ribbon beam technology. In such a technology, ions arriving at a work piece are organized into a ribbon ion beam that coats the work piece uniformly as the work piece is passed under the beam. There are significant cost advantages of using such ribbon beam technology. For example, for disc-type implanters, ribbon-beam technology eliminates the necessity for scanning a disc across an ion beam. For single-wafer implanters, a wafer need only be moved under an incoming ribbon beam along a single dimension, greatly simplifying the mechanical design of end-stations and eliminating a need for transverse electromagnetic scanning. Using a properly shaped ribbon beam, uniform dosing density is possible across a work piece with a single one-dimensional pass.

Technical challenges of generating and handling ribbon beams are non-trivial because ribbon beam/end station arrangements typically must produce dose uniformities better than 1%, angular accuracies better than 1 degree, and operate with ion energies below 1 keV. U.S. Pat. No. 5,350,926 entitled "High current ribbon beam ion implanter" and U.S. Pat. No. 5,834,786, entitled "Compact high current broad beam ion implanter", both issued to White et al., present some features of ribbon beam technology.

In a ribbon beam ion implanter, although relatively low energy may be used at a workpiece, it is often desirable to transport an ion beam over most beam line elements at a relatively higher energy. A reason for this is that transporting an ion beam at lower energy levels required at a final stage would cause space charge blow-up to occur. Thus, in some ion implanting devices a decelerator is used to reduce ion energy to a desired level just prior to ion beam incidence upon a substrate.

A common problem with conventional ribbon beam implanters is that some ions may lose their charge in a charge exchange reaction with residual gas along a beam line. Ions that have incurred a charge exchange reaction (referred to herein as "neutrals") are unaffected by a decelerator. Thus, they are likely to impact a target substrate at a higher energy level. This high energy contamination of the target substrate is undesirable and obviously may have a negative impact on a resulting implanted device.

One method of mitigating affects of neutrals is to apply an energy filter just after a decelerator stage in an ion implanter. Such an energy filter is usually effective at preventing high energy neutrals from reaching a target. However, a shortcoming of this solution is that a decelerated, low energy beam is very difficult to transport even over small distances because it is subject to large space charge blow up. Thus, transporting the beam through an energy filter becomes problematic because it will tend to be overly inclusive. That is, it will undesirably attenuate desired ions and prevent them from reaching a substrate with a desired energy and at a desired concentration. Also, only a limited amount of current may be transported through such filter, often with significant degradation of beam parallelism.

In view of the foregoing, it would be desirable to provide a technique for separating ions from neutrals in a ribbon beam ion implanter that overcomes some or all of the above-described inadequacies and shortcomings of known systems.

SUMMARY OF THE DISCLOSURE

A technique for improved ion beam transport is disclosed. In one particular exemplary embodiment, the technique may be realized as an ion implantation system comprising an ion source for generating an ion beam, a mass analyzer for selecting a desired ion species from ion particles in the ion beam, an ion decelerator configured to reduce an energy of ions in the ion beam, an end station for supporting at least one workpiece to be implanted with ions from the ion beam, and a neutral particle separator configured to remove neutrally-charged particles from the ion beam prior to reaching the ion decelerator.

In another particular exemplary embodiment, the technique may be realized as a method for implanting ions in an implantation system comprising generating an ion beam with an ion source, performing mass analysis on the ion beam to select a articular ion species, filtering the ion beam to remove neutral particles, decelerating the ion beam to an desired energy level, converting the ion beam to a ribbon beam, and applying the ribbon beam to a substrate.

In yet another particular exemplary embodiment, the technique may be realized as a method for removing unwanted particles from a ribbon shaped ion beam in an ion implantation system comprising filtering a high energy ion beam with an electrostatic deflector to remove neutral gas particles prior to ion beam deceleration in an ion implantation system.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

DETAILED DESCRIPTION OF EXEMPLARY EMBODIMENTS

Figure 1:
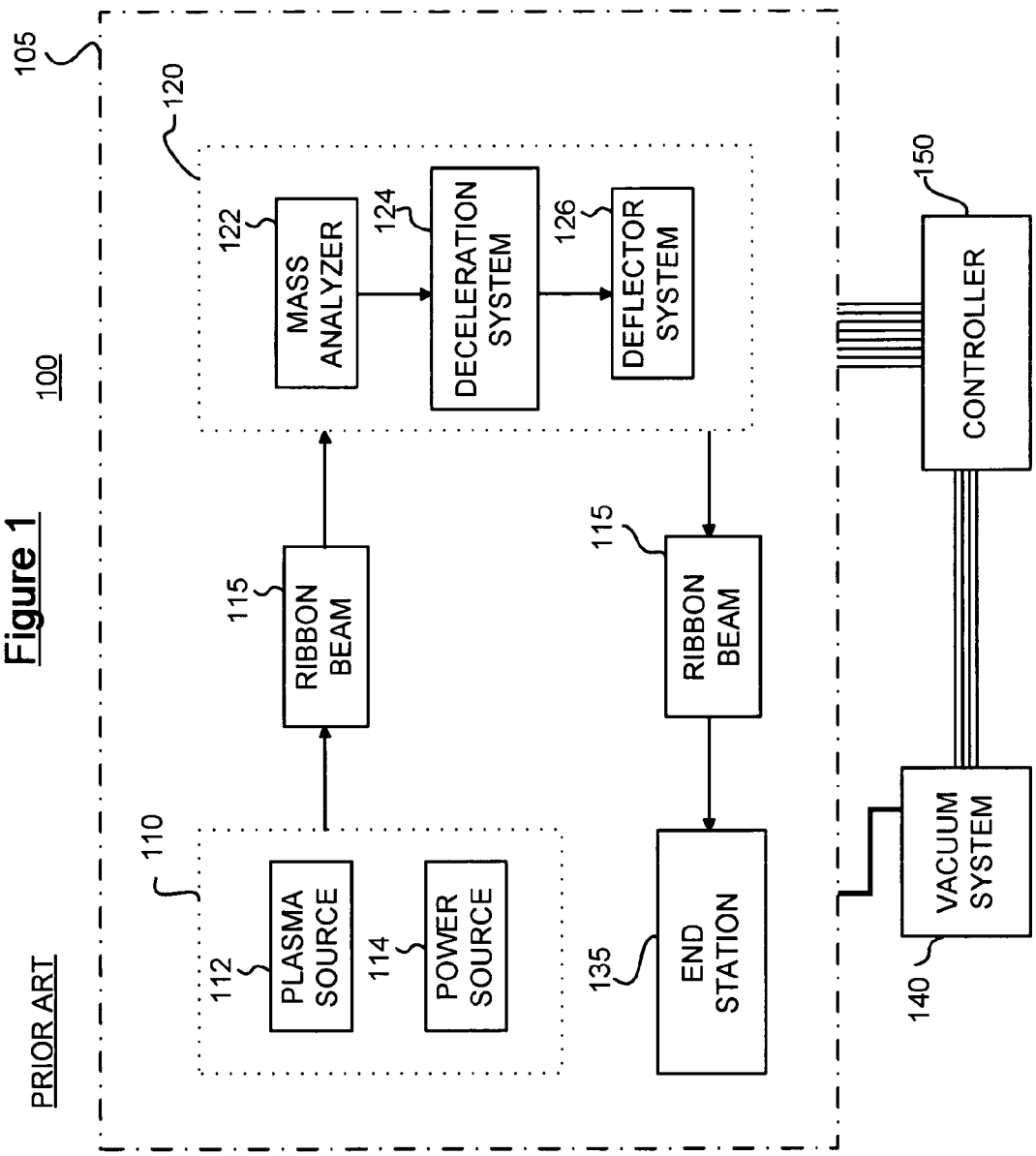
FIG. 1 is a schematic block diagram of an exemplary conventional ion implantation system.

Referring now to FIG. 1, there is shown a schematic block diagram of an of an exemplary conventional ion implantation system 100 in accordance with various embodiments of the present disclosure. The system 100 includes an ion source 110 for producing a ribbon shaped ion beam 115 along a beam path. The ion source 110 includes, for example, a plasma source 112 of a particular gas with an associated power source 114. The plasma source 112 may comprise a plasma confinement chamber from which an ion beam is extracted. The extracted ion beam may comprise the ribbon shaped ion beam 115, for example, having a width of about 400 mm for implantation of a 300 mm semiconductor wafer. An exemplary ribbon beam generating ion implantation system may be found in commonly assigned U.S. Pat. No. 6,635,880, entitled "High Transmission, Low Energy Beamline Architecture For Ion Implanter," the disclosure of which is hereby incorporated by reference in its entirety.

A beamline assembly 120 is provided downstream of the ion source 110 to receive the beam 115. The beamline assembly 120 may include a mass analyzer 122, a deceleration system 124, and a deflector system 126.

The beamline assembly 120 is situated along the path to receive the beam 115. The mass analyzer 122 includes a field generating component, such as a magnet (not shown), and operates to provide a magnetic field across a path of the ion beam so as to deflect ions from the ion beam 115 at varying trajectories according to a charge-to-mass ratio of respective ions in the beam 115. Ions traveling through the magnetic field experience a force which directs individual ions of a desired mass along the path of the beam and which deflects ions of undesired mass away from the path of the beam. As will be discussed in greater detail in the context of FIG. 3, the mass analyzer 122 may also comprise a mask having an aperture oriented at a trajectory of ions of the desired mass, thereby rejecting other ions of undesired mass.

The deceleration system 124 is controllable and selectively operable to alter (i.e., reduce) an energy associated with the ribbon beam 115. For example, at medium energies no substantial change in beam energy may be necessary, and the deceleration system 124 allows the beam 115 to pass there through without a substantial change. Alternatively, in low energy applications (e.g., for formation of shallow junctions in a semiconductor body), the energy of the beam 115 may need to be decelerated. In such circumstances, the deceleration system 124 is operable to reduce the energy of the beam 115 to a desired energy level by deceleration thereof.

The deflector system 126 may be used in low energy systems that employ deceleration prior to implantation into a workpiece. As discussed above, deflection may be used to prevent relatively high energy neutral contamination of a target substrate. The deflector system 126 may include, for example, deflection electrodes for deflecting the beam away from a beamline axis to remove neutral particles from the ribbon beam (due to their failure to deflect in the presence of a deflecting field) that may otherwise serve as energy contaminants.

With continued reference to the exemplary implanter system 100 depicted in FIG. 1, an end station 135 is also provided to receive the mass analyzed, substantially decontaminated ion beam 115 from the beamline assembly 120. The end station 135 typically supports one or more workpieces such as semiconductor wafers (not shown) disposed along the path of the beam 115 (however, offset from the original beamline axis due to the deflector 126) to be implanted using the ribbon ion beam 115. The end station 135 typically comprises a wafer drive system for moving wafers into and out of the path of the beam and on to subsequent processing stages. Note that such an end station 135 contemplates use of a batch system, wherein multiple workpieces may be rotated past the beam 115, or a single workpiece end station, wherein a single workpiece is scanned past the beam 115 or the beam 115 is scanned across the workpiece, respectively. The end station 135 may also include one or more detectors (not shown) for detecting a dose level of ions exposed to a target workpiece.

The implanter system 100 may also comprise a controller 150 and a vacuum system 140. The controller 150 may be or include a general purpose computer or a network of general purpose computers that are programmed to perform desired input/output and other functions. In various embodiments, the controller 150 may be a data processor programmed with instruction code for performing a semiconductor manufacturing process. In various embodiments, the controller 150 may include a power and/or data connection to the various system components including the beam source 110 and end station 135. The controller 150 may also include other electronic circuitry or components, such as application specific integrated circuits (e.g., ASICs), other hardwired or programmable electronic devices, discrete element circuits, FPGAs, etc. The controller 150 may also include devices, such as user input/output devices (keyboards, touch screens, user pointing devices, displays, printers, etc.), communication devices, data storage devices, mechanical drive systems, etc., to perform desired functions.

The controller 150 may communicate with the wafer drive system at the end station 135, which is capable of moving a wafer relative to the beam 115. For example, the wafer drive system may scan a wafer across the beam 115 so as to implant ions on to the surface of the wafer. The wafer drive system may include various different devices or systems to physically move a wafer in a desired way. For example, the wafer drive system may include servo drive motors, solenoids, screw drive mechanisms, one or more air bearings, position encoding devices, mechanical linkages, robotic arms or any other components that are well known in the art to move a wafer.

The vacuum system 140 may communicate with the controller 150, e.g., to provide information to the controller 150 regarding a current vacuum level in one or more portions of a chamber 105 during an implantation process. The vacuum system 140 may also include one or more pressure sensors that monitor pressure in the chamber 105 and that communicate pressure readings to the controller 150. Alternatively, these pressure sensors may be separate from the vacuum system 140 and in communication directly with the controller 150.

As discussed above, in an ion implantation process where it is desirable to utilize a low energy ion beam, such as in the manufacturing of shallow junctions in a semiconductor body, it is often advantageous to operate the beam 115 at a high energy prior to incidence upon a substrate. The reason for this is that ion beam transport is efficient at high energies but is less efficient at low energies due to effects of space charge neutralization loss and beam blow-up. In such cases, a decelerator may be used to reduce the energy of the beam 115 to a desired lower level prior to reaching the end station 135. However, deceleration alone is not completely effective at reducing the energy of the beam 115 because along a path of the beam 115 some level of beam contamination may occur due to beam particles neutralizing in residual gas or by small angle scattering from surfaces before the beam 115 is decelerated to its final energy. These effects are particularly severe in regions of electrical fields, such as deceleration gaps needed to decelerate the beam 115. The conventional system depicted in FIG. 1 uses the deflector system 126 following the deceleration system 124 to remove contaminants from the beam. The deflector system 126 deflects ions while having no effect on neutrals. While this is effective in separating neutrals, it reduces the quality of the beam 115, i.e., the beam's strength and parallelism—factors that will effect final implanted device properties. A low energy beam is very vulnerable to degradation. Subjecting a low energy beam to any other components, such as the deflector system 126, may result in a reduction in beam quality, reduced parallelism of the beam and ultimately, less precise beam control, and an implantation process that produces inferior components.

As previously discussed, in an alternative to the post-deceleration deflector system 126 shown in the system 100 of FIG. 1, some conventional ion implanters may utilize an energy filter to prevent "high energy" neutrals from contaminating a target. However, energy filters may also degrade the quality of a sensitive low energy beam.

Figure 2:
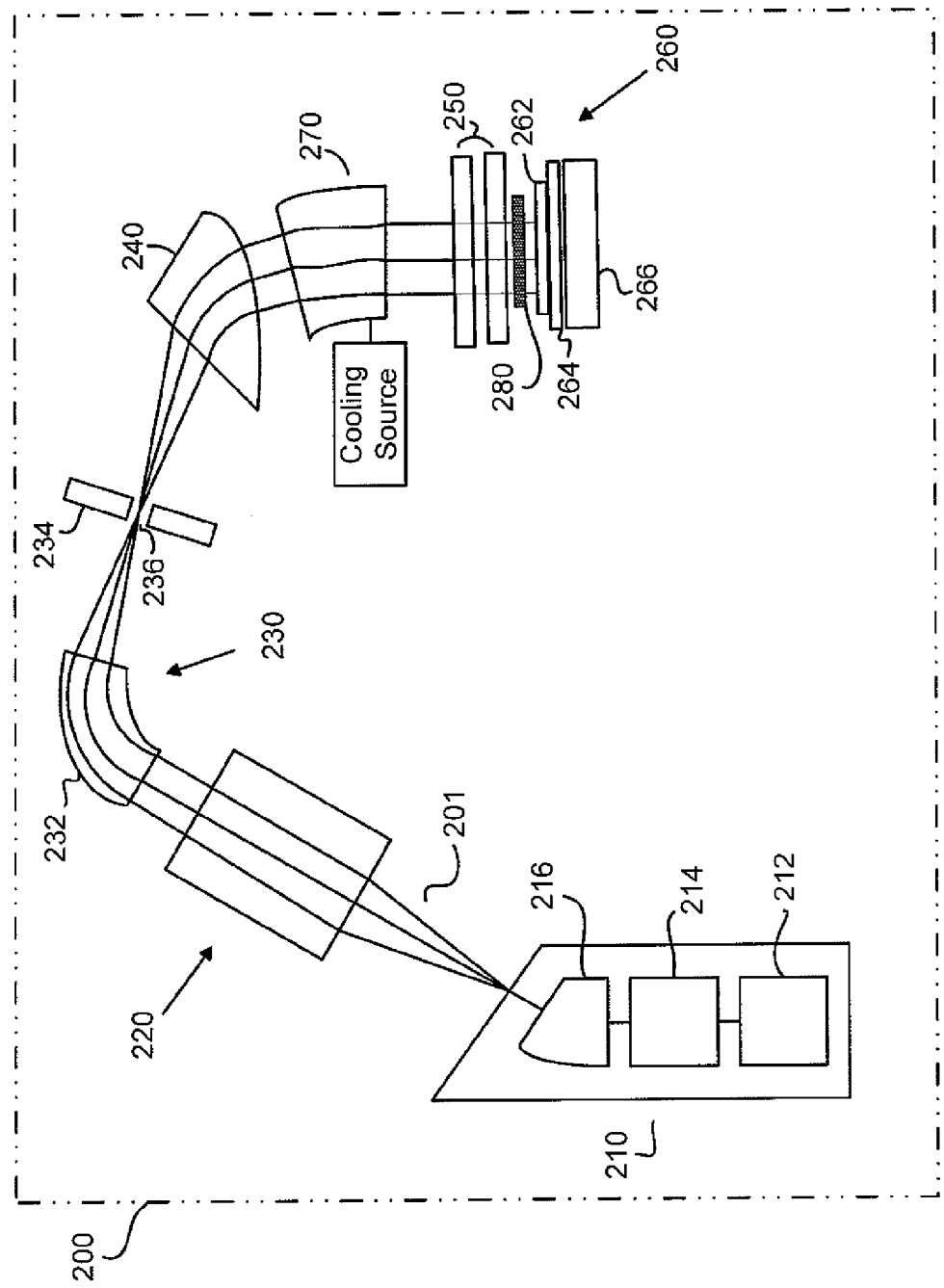
FIG. 2 is a block diagram of beam line components of a ion implanter apparatus in accordance with various embodiments of the present disclosure.

Referring now to FIG. 2, there is shown a block diagram of beam line components of an ion implantation system 200 in accordance with an embodiment of the present disclosure. In the system 200 of FIG. 2, an ion beam generator 210 generates an ion beam 201 of a desired species, accelerates the ions in the ion beam 201 to a desired transport energy level, performs mass/energy analysis of the ion beam to remove energy and mass contaminants, and supplies an energetic ion beam 201 having a low level of energy to a target workpiece such as a silicon wafer.

An end station 260 includes a platen 264 that supports a semiconductor wafer 262 or other workpiece in the path of scanned ion beam 201 such that ions of a desired species are implanted into the wafer 262, thereby changing material properties of any unmasked portions of the wafer 262. The end station 260 may also include a Faraday cup or other dose detector for monitoring ion beam dose and dose uniformity.

The ion beam generator 210 of FIG. 2 includes an ion beam source 214, a source filter 216, and a power supply 212 for energizing the ion beam 201. The source filter 216 is preferably positioned in close proximity to the ion beam source 214. An acceleration/deceleration column 220 is positioned between the source filter 220 and a mass analyzer 230 for imparting the appropriate transport energy to the ion beam 201. The mass analyzer 230 includes a dipole analyzing magnet 232 and a mask 234 having a resolving aperture 236. The mask 234 is located along a path of the beam 201 at a position that allows only those ions having a desired mass to pass through the aperture 236, thereby insuring that the ion beam 201 only contains a desired species of ions.

In various embodiments, a scanner may also be used along the path of the beam 210 following the mass analyzer 230 if the system 200 employs a scanning beam. Alternatively, the beam 201 may be fixed and the end station 260 may include a scanning mechanism to move a target workpiece across the beam 201.

The system 200 may also include an angle corrector 240 to deflect ions in beam 201 to produce a scanned ion beam having parallel ion trajectories, thus focusing the beam 201. In particular, the angle corrector 240 may comprise magnetic pole pieces which are spaced-apart to define a gap and a magnet coil which is coupled to a power supply (not shown). The beam 201 may pass through the gap between the pole pieces and be deflected in accordance with a magnetic field in the gap. The magnetic field may be adjusted by varying a current through the magnet coil.

The system 200 may further include an electrostatic deflector 270. In various embodiments, the angle corrector 240 focuses the beam 201 to produce a high energy ribbon beam. As discussed herein, despite the masking provided by the mass analyzer 230, the beam 201 may be subject to neutral particle contamination. Neutrals are formed by charge exchange reactions with residual gas. The residual gas may result from the plasma source 214 and from off-gassing at a workpiece 262 surface during ion implantation. Neutrals may even be formed at the electrostatic deflector 270.

When the ion beam 201 enters the electrostatic deflector 270, electrodes in the deflector 270 generate an electric field that alters the trajectory of ions toward a target while having no affect on neutral particles. Thus, neutrals are effectively separated from ions. Also, by applying the electrostatic deflector 270 along a path of the beam 201 where the beam 201 still has a high energy level, quality of the beam 201 is not degraded and/or degradation is minimized as compared to the prior art beamline architecture.

Another feature of the electrostatic deflector 270 according to various embodiments of the disclosure is a reduction of background pressure by cryogenically trapping background gas at the electrostatic deflector 270. As noted above, background gas pressure may be directly correlated to a neutral particle production rate. Therefore, reducing this gas pressure will have a direct affect on beam purity. Various embodiments of the disclosure may utilize a cryogenic coolant source, such as liquid nitrogen, to cool the electrodes of the electrostatic deflector 270, thereby trapping background gasses through condensation.

The system 200 may further include a deceleration stage 250 comprised of one or more deceleration elements. Lenses or other known means may be used to decelerate the beam 201. Various embodiments of the disclosure will provide focusing correction through optics of the decelerator optics to compensate for space charge defocusing that occurs in lower energy regions such as in the deceleration stage 250.

The system 200 additionally includes a lens corrector 280. It is preferred that the lens corrector 280 is applied just following an exit region of the deceleration stage 250. In various embodiments, the lens corrector this may be a structure as described in published United States Patent Application Nos. 2006/0169924 and 2005/0242294, both entitled "Controlling the Characteristics of Implanter Ion-Beams," the disclosures of which are hereby incorporated by reference in their entirety. The lens corrector 280 may make final parallelism corrections to correct for any low energy degradation, thereby insuring that the ribbon beam 201 reaching the target substrate 262 is of high precision and therefore capable of uniform ion doping.

Figure 3:
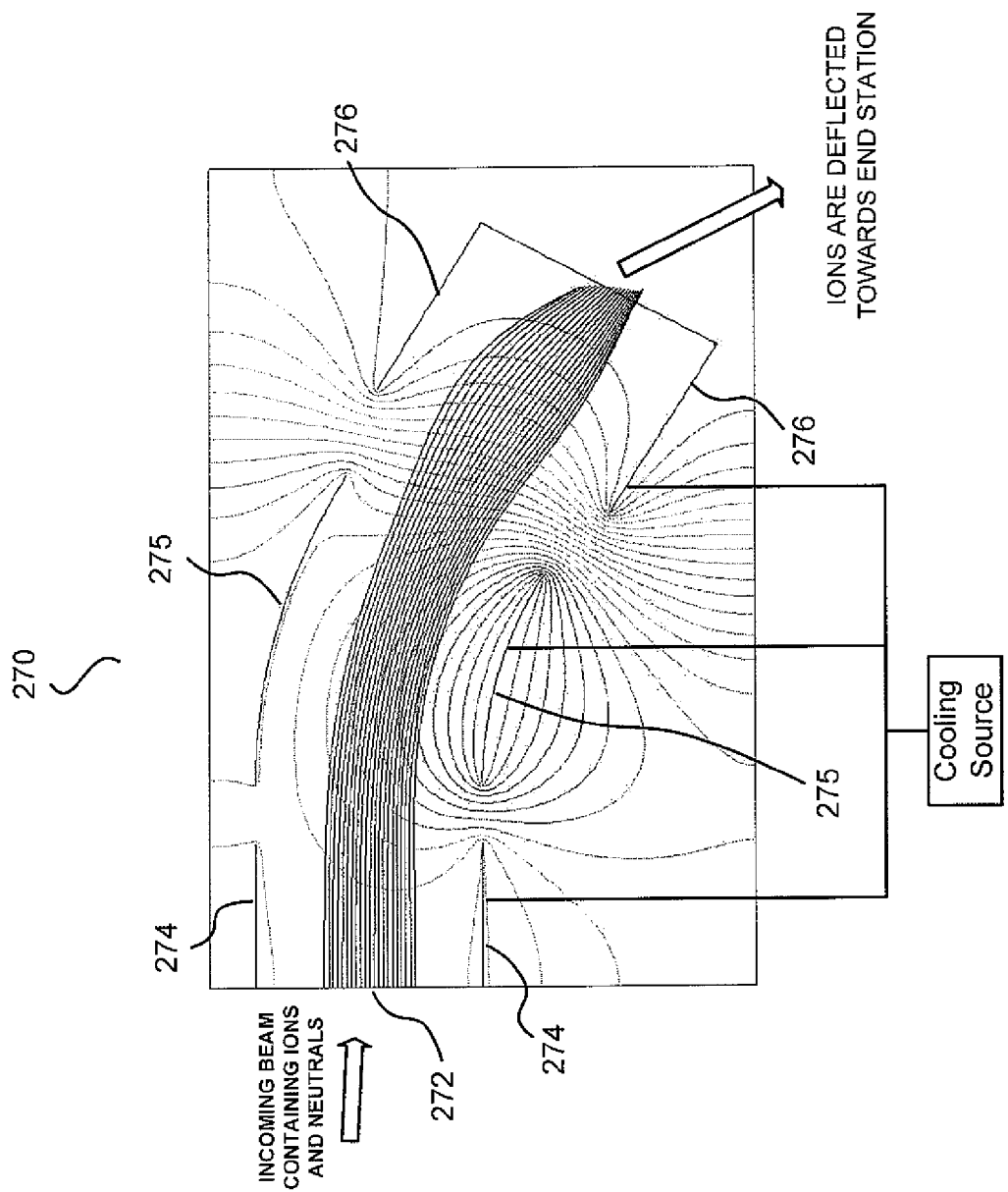
FIG. 3 is a cross sectional view of an electrostatic energy filter including a set of linearly symmetric electrodes for use with an ion implanter in accordance with various embodiments of the present disclosure.

Referring now to FIG. 3, in this Figure, a cross sectional view of an electrostatic energy filter 270 including a set of linearly symmetric electrodes for use with an ion implanter in accordance with various embodiments of the present disclosure is depicted. The electrostatic filter (deflector) 270 comprises an entrance region 272 placed along the ion beam path 201. As noted herein, this high energy beam may be comprised of ions as well as contaminated with some neutral particles. An increase in background pressure indicating the presence of background gas may exacerbate neutral particle creation. In various embodiments, a charge is applied to the electrodes 274, 275, 276 with a voltage source (not shown) to generate an electric field near the electrodes 274, 275, 276. This electric field will influence the path of the beam of charged ions but will have no effect on the trajectory of neutral particles. Thus, the electrostatic deflector 270 is designed to deflect only the desired ions toward a target while neutral particles continued unabated in the process chamber or are captured, contained, or otherwise prevented from reaching a target.

In the exemplary energy filter 270 of FIG. 3, a compact design incorporating an energy filter and decelerator are combined. In this example, the incoming ion beam is subjected to an electric field created by a first set of parallel electrodes 274, a second field created by a second set of arcuate electrodes 275 that produce an electric field pointed at a center of curvature that deflects the beam toward the end station, and a final set of parallel electrodes 276 at higher potential than the first electrodes 274, providing ion deceleration to the final energy. In various embodiments, a lens corrector, such as is disclosed in the aforementioned '924 and '294 applications, is positioned just past the final decelerating electrodes 276 to perform final beam parallelism correction, as discussed in greater detail in the context of FIGS. 2 and 4.

In addition to deflecting ions, the electrostatic defector 270 according to various embodiments of the disclosure also includes a mechanism to reduce background pressure thereby reducing the formation of additional neutral particles along the beampath. In various embodiments, as discussed in the context of FIG. 2, this mechanism comprises a background gas trap that is facilitated by cryogenic cooling of the electrodes 274, 275, 276. The electrostatic filter may include an outer wall or other thermal path that is connects the electrodes 274, 275, 276 to a cooling source such as a cryogenic materials including, for example, liquid nitrogen. The cryogenic materials may be used to conductively cool the electrodes 274, 275, 276 themselves, or a structure in contact with the electrodes 274, 275, 276. It is expected that this will cause any background gas in the presence of the electrodes 274, 275, 276 to condense to a liquid, effectively trapping the gasses as they are formed during the implantation process and/or ion beam transport. The condensate will accumulate on the cold surfaces and is periodically evaporated in a maintenance operation called "regeneration", by simply allowing the electrode surfaces to rise to room temperature. The cryogenic material may be supplied from a reservoir within the implanter chamber or externally through one or more supply lines. In various embodiments, this process will be controlled by the implanter system's controller. The electrode structure is designed to produce electric fields that deflect the ions in a manner that minimizes ion intercept. Neutrals in contrast, propagate in straight lines, unaffected by the electric fields and bouncing between surfaces. The surfaces may be textured so as to present a near perpendicular intercept to glancing neutrals (saw tooth pattern), thus bouncing the particles preferentially backward and generally impeding the gas diffusion into the high beam energy region.

Figure 4:
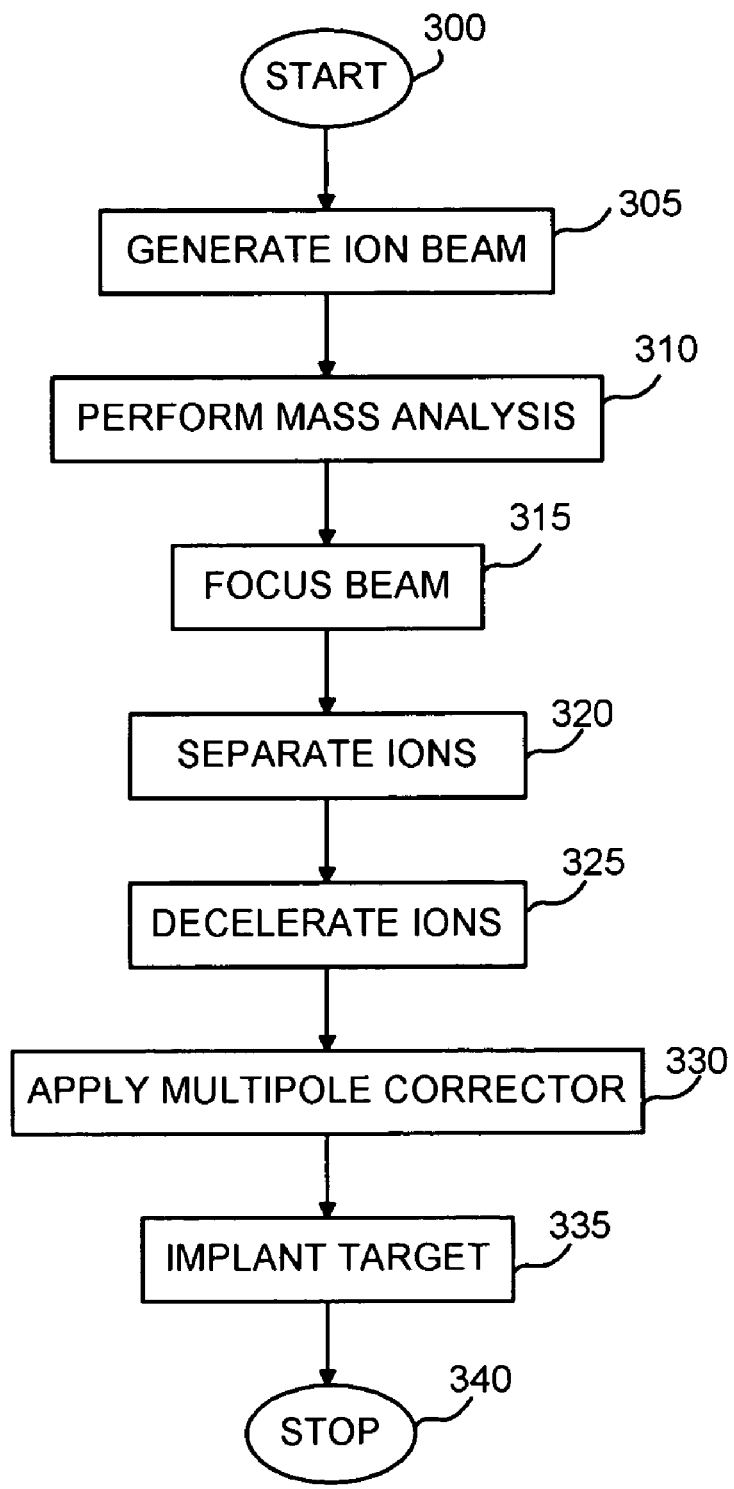
FIG. 4 is a flow chart detailing the steps of a method for generating a ribbon ion beam with an implanter tool in accordance with various embodiments of the disclosure.

Referring now to FIG. 4, this Figure is a flow chart detailing the steps of a method for generating a ribbon ion beam with an ion implanter tool in accordance with an embodiment of the disclosure. It should be appreciated that additional steps may be performed than those detailed in FIG. 4. That is, FIG. 4 is not intended to be an exhaustive list of the process steps.

The method begins in step 300 and proceeds to step 305 where an ion beam is generated. In various embodiments, this comprises generating a ribbon type ion beam or a diverging ion beam that is later converted to a ribbon beam using one or more beam transport components. In various embodiments, this comprises using an ion species selected from the group consisting of arsenic, phosphorus, germanium, boron, and hydrogen, that has a beam energy ranging from below 1 keV to above 80 keV. In various embodiments, this may also comprise accelerating the ion beam to an appropriate transport energy level with a beam accelerator.

With continued reference to FIG. 4, operation of the method proceeds to step 310. In step 310 mass analysis is performed. As is well known in the art, this comprises sending ions on different trajectories with a magnetic field based on a charge-to-mass ratio of the respective ions. Ions traveling through the magnetic field experience a force which directs individual ions of a desired mass along a path of the beam and which deflects ions of undesired mass away a path of the beam. In various embodiments, a mask, having an aperture positioned along the trajectory of the ions having the desired mass is used to purify the beam to contain only those ions. Then, in step 315, the ion beam is focused. In various embodiments, this may comprise applying one or optical or magnetic elements to condition the beam, such as an angle corrector to convert the beam from a diverging beam to a parallel ribbon beam, to enhance parallelism of the beam or effect other properties of the beam. Various embodiments, may not perform this step.

Next, in step 320, ion separation is performed. In various embodiments, this comprises subjecting the high energy ion beam to an electrostatic deflector positioned along a path of the beam. As discussed herein, the electrostatic deflector is used to deflect ions toward the target, thus putting them on a different trajectory than neutrals and preventing the neutrals from contaminating a target with excess energy. Also, in various embodiments, separating ions comprises applying a cooling mechanism to deflector electrodes to trap background gases that may be correlated to neutral production during implantation.

Next, after ion separation in step 320, operation of the method proceeds to step 325 where deceleration of the ion beam is performed to reduce the beam's energy to a level appropriate for implantation. As discussed herein, various optical, electrical and/or magnetic components may be utilized to perform beam focusing designed to compensate for space charge defocusing that occurs in lower energy regions.

Next, in step 330, following deceleration of the ion beam, the beam is subjected to a multi-pole corrector to perform final parallelism correction prior to the beam's incidence upon a target. In various embodiments, this comprises passing the beam through a lens corrector as described in the aforementioned '924 and '294 applications. Such a lens corrector may be characterized in having a high-permeability rectangular steel structure aligned with its long axis parallel to the width of a ribbon beam and with its geometric center coincident with the geometric center of the ribbon beam. Support coils surrounding the long axis portions are used to generate the desired magnetic fields within a gap through which the ions forming the ribbon beam are directed. In various embodiments, application of the multi-pole corrector in step 330 will permit adjustment of the width of a ribbon beam at the work piece, correction of inaccuracies in the intensity distribution across the width of a ribbon beam, angle of incidence correction at the work piece, and approximate compensation for the beam expansion effects arising from space charge blow-up, thereby providing the beam with good uniformity and angular accuracy In step 335, after beam conditioning is complete, ions are implanted onto a target with the ribbon ion beam. In various embodiments the ribbon ion beam is applied at a fixed position and a wafer scanner attached to a platen moves the wafer across the beam at a uniform velocity according to a particular device manufacturing recipe. In various embodiments, the beam may also move with respect to a target wafer and combinations of beam movement and wafer movement may be used. The method ends in step 340.

It should be appreciated that the method steps outlined in the flow chart of FIG. 3, though disclosed in the context of a ribbon beam ion implanter, may also be applicable to other types of ion implanters and other semiconductor processing equipment generally, including equipment used in deposition sub-processes, removal sub-processes, patterning sub-processes and sub-processes for performing modification of the electrical properties of substrate material.

Through the various embodiments of this disclosure, ion and neutral particle separation may be achieved through electrostatic filtering, space charge defocusing compensation may be provided by decelerator optics, reduction of process chamber background pressure and therefore neutral particle creation may be provided and final post deceleration beam correction may be provided, thereby achieving an ion implantation process with increased precision over existing processes and having improved beam transport properties.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. An ion implantation system comprising:
   an ion source for generating an ion beam;
   a mass analyzer for selecting a desired ion species from ion particles in the ion beam;
   an ion decelerator configured to reduce an energy of ions in the ion beam;
   an end station for supporting at least one workpiece to be implanted with ions from the ion beam; and
   a neutral particle separator configured to remove neutrally-charged particles from the ion beam prior to reaching the ion decelerator, wherein the neutral particle separator comprises a gas trap mechanism to trap gas produced at a surface of the neutral particle separator during implantation.

2. The system according to claim 1, further comprising an angle corrector magnet configured to deflect ions of the desired ion species and to convert the ion beam to a ribbon shaped ion beam prior to incidence upon the at least one workpiece.

3. The system according to claim 1, wherein the neutral particle separator comprises an energy filter.

4. The system according to claim 3, wherein the energy filter comprises an electrostatic deflector.

5. The system according to claim 1, wherein the ion decelerator comprises a multi-stage optical ion decelerator.

6. The system according to claim 1, wherein the gas trap mechanism comprises a cooling mechanism configured to cool a portion of the neutral particle separator.

7. The system according to claim 6, wherein the gas trap mechanism traps background gas by condensation of cooled particles on the portion of the neutral particle separator.

8. The system according to claim 1, wherein the neutral particle separator comprises one or more surfaces configured to deflect ions in the ion beam.

9. The system according to claim 1, further comprising a multi-pole corrector located after the ion decelerator.

10. A method for implanting ions in an implantation system comprising:
    generating an ion beam with an ion source;
    performing mass analysis on the ion beam to select a particular ion species;
    filtering the ion beam to remove neutral particles by passing the ion beam through an electrostatic deflector wherein the electrostatic deflector is configured to reduce background pressure through cooling-based condensation of background gasses;
    decelerating the ion beam to an desired energy level;
    converting the ion beam to a ribbon beam; and
    applying the ribbon beam to a substrate.

11. The method according to claim 10, wherein the electrostatic deflector is configured to deflect only desired ions.

12. The method according to claim 10, wherein the electrostatic deflector is configured to deflect ions in the ion beam.

13. A method for removing unwanted particles from a ribbon shaped ion beam in an ion implantation system comprising:
    filtering a high energy ion beam with an electrostatic deflector to remove neutral gas particles prior to ion beam deceleration in an ion implantation system; and
    reducing background pressure around the electrostatic deflector.

14. The method according to claim 13, wherein reducing background pressure comprises cryogenically cooling at least a portion of the electrostatic deflector to trap background gas molecules through condensation.

* * * * *

UNITED STATES PATENT AND TRADEMARK OFFICE
CERTIFICATE OF CORRECTION

PATENT NO.        : 7,619,228 B2                                    Page 1 of 1
APPLICATION NO. : 11/529508
DATED             : November 17, 2009
INVENTOR(S)       : Victor Benveniste It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 444 days.

Signed and Sealed this

Twenty-sixth Day of October, 2010

David J. Kappos
*Director of the United States Patent and Trademark Office*